United States Patent
Lu et al.

(10) Patent No.: US 9,401,366 B1
(45) Date of Patent: Jul. 26, 2016

(54) LAYOUT PATTERN FOR 8T-SRAM AND THE MANUFACTURING METHOD THEREOF

(71) Applicant: UNITED MICROELECTRONICS CORP., Hsin-Chu (TW)

(72) Inventors: Tien-Yu Lu, Taichung (TW); Chang-Hung Chen, Tainan (TW); Yu-Tse Kuo, Tainan (TW); Chun-Hsien Huang, Tainan (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/792,636

(22) Filed: Jul. 7, 2015

(30) Foreign Application Priority Data

Jun. 17, 2015 (CN) .......................... 2015 1 0336560

(51) Int. Cl.
| | |
|---|---|
| *G11C 11/00* | (2006.01) |
| *H01L 27/088* | (2006.01) |
| *H01L 27/11* | (2006.01) |
| *H01L 27/02* | (2006.01) |
| *H01L 29/06* | (2006.01) |
| *G11C 11/412* | (2006.01) |
| *H01L 21/84* | (2006.01) |
| *H01L 27/105* | (2006.01) |
| *H01L 29/423* | (2006.01) |

(52) U.S. Cl.
CPC .......... *H01L 27/1108* (2013.01); *G11C 11/412* (2013.01); *H01L 21/845* (2013.01); *H01L 27/0207* (2013.01); *H01L 27/1052* (2013.01); *H01L 29/0684* (2013.01); *G11C 11/4125* (2013.01); *H01L 27/1104* (2013.01); *H01L 29/42392* (2013.01)

(58) Field of Classification Search
CPC ............. G11C 11/412; G11C 11/4125; H01L 27/1108; H01L 27/0207; H01L 27/1052; H01L 27/1104; H01L 29/0684; H01L 29/42392; H01L 21/845
USPC ........ 365/154, 185.07, 189.14, 203; 257/368, 257/369, 390, E27.06, E27.062, E27.099, 257/E27.112, E21.661; 438/106, 107, 128
See application file for complete search history.

(56) References Cited

U.S. PATENT DOCUMENTS

| | | | |
|---|---|---|---|
| 6,970,373 B2 | 11/2005 | Datta | |
| 7,952,912 B2* | 5/2011 | Kulkarni | G11C 11/413 365/154 |
| 7,994,583 B2 | 8/2011 | Inaba | |
| 8,913,455 B1* | 12/2014 | Camarota | H01L 21/8238 365/154 |

(Continued)

*Primary Examiner* — Dao H Nguyen
(74) *Attorney, Agent, or Firm* — Winston Hsu; Scott Margo

(57) ABSTRACT

The present invention provides a layout pattern of an 8-transistor static random access memory (8T-SRAM), at least including a first diffusion region, a second diffusion region and a third diffusion region disposed on a substrate, a critical dimension region being disposed between the first diffusion region and the third diffusion region. The critical dimension region directly contacts the first diffusion region and the third diffusion region, a first extra diffusion region, a second extra diffusion region and a third extra diffusion region disposed surrounding and directly contacting the first diffusion region, the second diffusion region and the third diffusion region respectively. The first, the second and the third extra diffusion region are not disposed within the critical dimension region.

19 Claims, 4 Drawing Sheets

(56) References Cited

U.S. PATENT DOCUMENTS

| | | | |
|---|---|---|---|
| 2007/0279965 A1* | 12/2007 | Nakazato | G11C 11/4125 365/154 |
| 2010/0103719 A1* | 4/2010 | Lee | G11C 11/412 365/154 |
| 2011/0075470 A1* | 3/2011 | Liaw | G11C 8/16 365/154 |
| 2013/0141963 A1* | 6/2013 | Liaw | G11C 11/412 365/156 |
| 2013/0154027 A1* | 6/2013 | Liaw | H01L 27/1104 257/390 |
| 2013/0181297 A1* | 7/2013 | Liaw | G11C 11/412 257/390 |
| 2015/0302917 A1* | 10/2015 | Grover | G11C 11/412 365/51 |

* cited by examiner

US 9,401,366 B1

LAYOUT PATTERN FOR 8T-SRAM AND THE MANUFACTURING METHOD THEREOF

BACKGROUND OF THE INVENTION

1. Field of the Invention

The invention relates to a static random access memory (SRAM), and more particularly, to a layout pattern of an 8 transistors SRAM (8T-SRAM).

2. Description of the Prior Art

An embedded static random access memory (SRAM) comprises a logic circuit and a static random access memory connected to the logic circuit. SRAM is a kind of volatile memory cell, which means it preserves data only while power is continuously applied. SRAM is built of cross-coupled inverters that store data during the time that power remains applied, unlike dynamic random access memory (DRAM) that needs to be periodically refreshed. Because of its high access speed, SRAM is also used in computer systems as a cache memory.

However, as pitch of the exposure process decreases, it has been difficult for the current SRAM architecture to produce desirable patterns. Hence, how to enhance the current SRAM architecture for improving exposure quality has become an important task in this field.

SUMMARY OF THE INVENTION

The present invention provides a layout pattern of an 8-transistor static random access memory (8T-SRAM), at least comprising a first diffusion region, a second diffusion region and a third diffusion region disposed on a substrate, a critical dimension region being disposed between the first diffusion region and the third diffusion region, wherein the critical dimension region directly contacts the first diffusion region and the third diffusion region, a first extra diffusion region, a second extra diffusion region and a third extra diffusion region disposed surrounding and directly contacting the first diffusion region, the second diffusion region and the third diffusion region respectively, wherein the first, the second and the third extra diffusion region are not disposed within the critical dimension region.

The present invention further provides a method for forming a layout pattern of an 8-transistor static random access memory (8T-SRAM), at least comprising: a first diffusion region, a second diffusion region and a third diffusion region are formed and disposed on a substrate, a critical dimension region being defined and disposed between the first diffusion region and the third diffusion region, wherein the critical dimension region directly contacts the first diffusion region and the third diffusion region, and a first extra diffusion region, a second extra diffusion region and a third extra diffusion region are formed, surrounding and directly contacting the first diffusion region, the second diffusion region and the third diffusion region respectively, wherein the first, the second and the third extra diffusion region are not disposed within the critical dimension region.

One preferred embodiment of the present invention further forms the extra diffusion regions surrounding each diffusion region, so the beta ratio can be increased, and thereby improve the performance of the 8T-SRAM, but the 8T-SRAM still maintains a good stability. In addition, each extra diffusion region will not disposed within the critical dimension region. Therefore, the extra diffusion regions will not influence the length or the width of the critical dimension region, thereby preventing the shorting issues.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
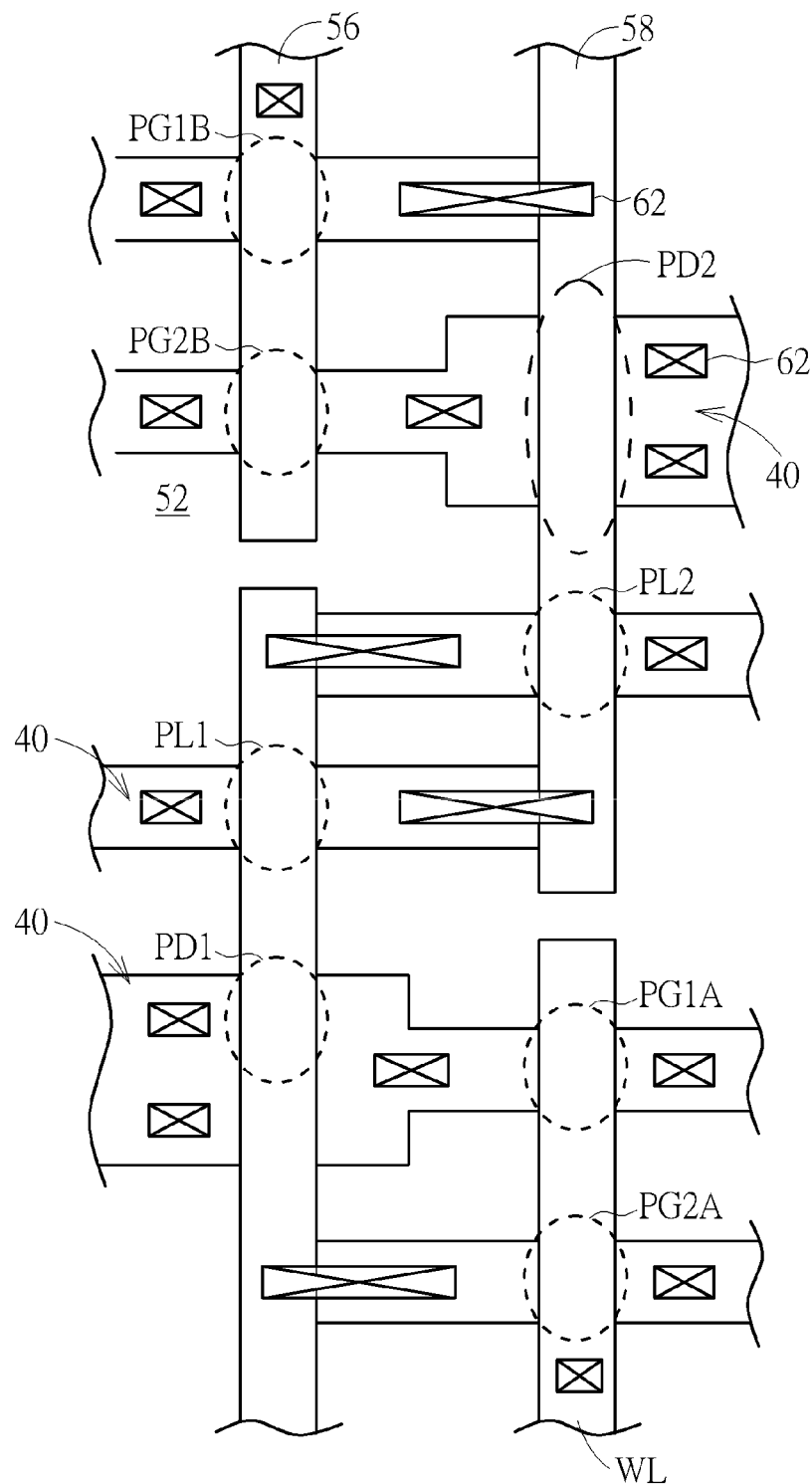
FIG. 1 illustrates a layout diagram of a SRAM according to a first preferred embodiment of the present invention.
Figure 2:
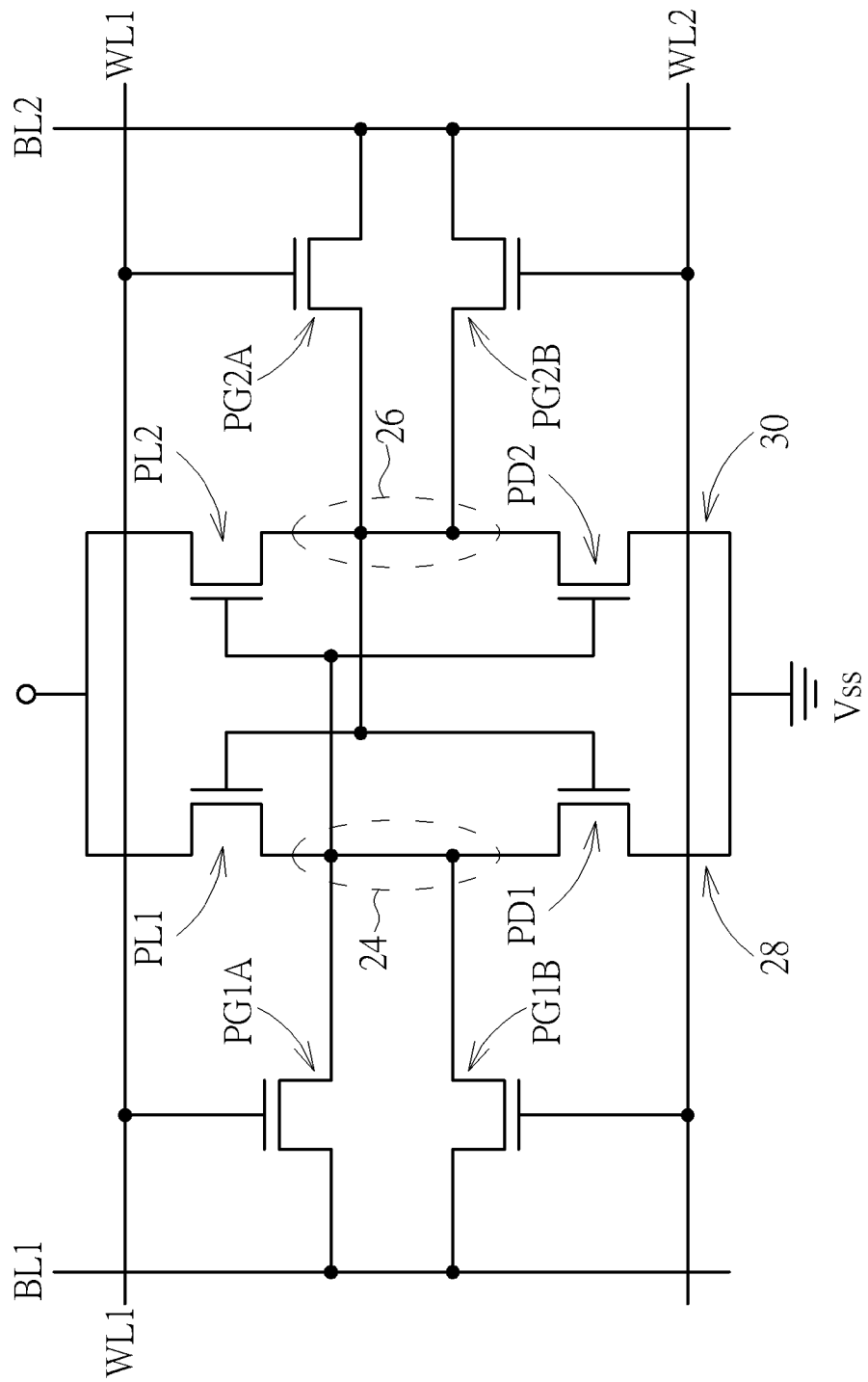
FIG. 2 illustrates a circuit diagram of an eight-transistor SRAM (8T-SRAM) cell of a SRAM of the present invention.

Referring to FIGS. 1-2, FIG. 1 illustrates a layout diagram of a static random access memory (SRAM) according to a preferred embodiment of the present invention, and FIG. 2 illustrates a circuit diagram of an eight-transistor SRAM (8T-SRAM) cell of a SRAM of the present invention.

As shown in FIGS. 1-2, the SRAM device of the present invention preferably includes at least one SRAM cell, each SRAM cell including an eight-transistor SRAM (8T-SRAM) cell 10.

In this embodiment, each 8T-SRAM cell 10 is composed of a first pull-up transistor PL1, a second pull-up transistor PL2, a first pull-down transistor PD1, a second pull-down transistor PD2, a first up access transistor PG1A, a first down access transistor PG1B, a second up access transistor PG2A and a second down access transistor PG2B. These eight transistors constitute a set of flip-flops. The first and the second pull-up transistors PL1 and PL2, and the first and the second pull-down transistors PD1 and PD2 constitute a latch that stores data in the storage nodes 24 and 26. Since the first and the second pull-up transistors PL1 and PL2 act as power load devices, they can be replaced by resistors. Under this circumstance, the static random access memory becomes a four-transistor SRAM (4T-SRAM). In this embodiment, the first and the second pull-up transistors PL1 and PL2 preferably share a source/drain region and electrically connect to a voltage source Vcc, the first and the second pull-down transistors PD1 and PD2 share a source/drain region and electrically connect to a voltage source Vss.

Preferably, the first and the second pull-up transistors PL1 and PL2 of the 8T-SRAM cell 10 are composed of p-type metal oxide semiconductor (PMOS) transistors; the first and the second pull-down transistors PD1 and PD2, the first up and the second up access transistors PG1A and PG2A, and the first up and the second down access transistors PG1B and PG2B are composed of n-type metal oxide semiconductor (NMOS) transistors. The first pull-up transistor PL1 and the first pull-down transistor PD1 constitute an inverter, which further form a series circuit 28. One end of the series circuit 28 is connected to a voltage source Vcc and the other end of the series circuit 28 is connected to a voltage source Vss. Similarly, the second pull-up transistor PL2 and the second pull-down transistor PD2 constitute another inverter and a series circuit 30. One end of the series circuit 30 is connected to the voltage source Vcc and the other end of the series circuit 30 is connected to the voltage source Vss.

The storage node 24 is connected to the respective gates G of the second pull-down transistor PD2 and the second pull-up transistor PL2. The storage node 24 is also connected to the drains D of the first pull-down transistor PD1, the first pull-up transistor PL1, the first up access transistor PG1A, and the first down access transistor PG1B. Similarly, the storage node 26 is connected to the respective gates G of the first pull-down transistor PD1 and first the pull-up transistor PL1. The storage node 26 is also connected to the drains D of the second pull-down transistor PD2, the second pull-up transistor PL2, the second up access transistor PG2A and the second down access transistor PG2B. The gates of the first up access transistor PG1A and the second up access transistor PG2A are respectively coupled to a first word line (WL1); the gates of the first down access transistor PG1B and the second down access transistor PG2B are respectively coupled to a second word line (WL2); the source S of the first up access transistor PG1A and the second up access transistor PG2A are respectively coupled to a first bit line (BL1); the source S of the first down access transistor PG1B and the second down access transistor PG2B are respectively coupled to a second bit line (BL2).

In this embodiment, the SRAM cell 10 is disposed on a substrate 52, such as a silicon substrate or silicon-on-insulator (SOI) substrate. The substrate may be a planar substrate, or a plurality of fin-shaped structures (not shown) may be formed on the substrate 52. Next, a plurality of gate structures 56 and 58 are formed on the substrate 52. In this embodiment, take a planar 8T-SRAM as an example. In other words, this embodiment does not include the fin-shaped structures, but the present invention is not limited thereto. In another case, the fin-shaped structures may also be comprised within the scope of the present invention.

Afterwards, an ion implantation process and an anneal process are performed in sequence, to form a plurality of diffusion regions 40 in the substrate 52 and surrounding each transistor (including the first pull-up transistor PL1, the second pull-up transistor PL2 . . . ), wherein the diffusion regions 40 are disposed on two sides of the gate structure 56, 58. The diffusion regions 40 mentioned above are used as the source/drain region of each transistor. Next, a plurality of contact plugs 62 are formed, wherein each contact plug 62 may be a single layer contact or a multiple layer contact, disposed on the diffusion region 40 (the source/drain region of each transistor), used as to electrically connect the voltage source Vcc, the voltage source Vss, the word lines WL1, WL2 or the bit lines BL1, BL2. In another case, the contact plug 62 may contact the source/drain region of the gate structure 56 and the gate structure 58 simultaneously, used as the share contact of the 8T-SRAM cell. In addition, the shallow trench isolation (STI, not shown) may be formed and surrounding each diffusion region 40. This is well known to those skilled in the art, and will not be described here.

Figure 3:
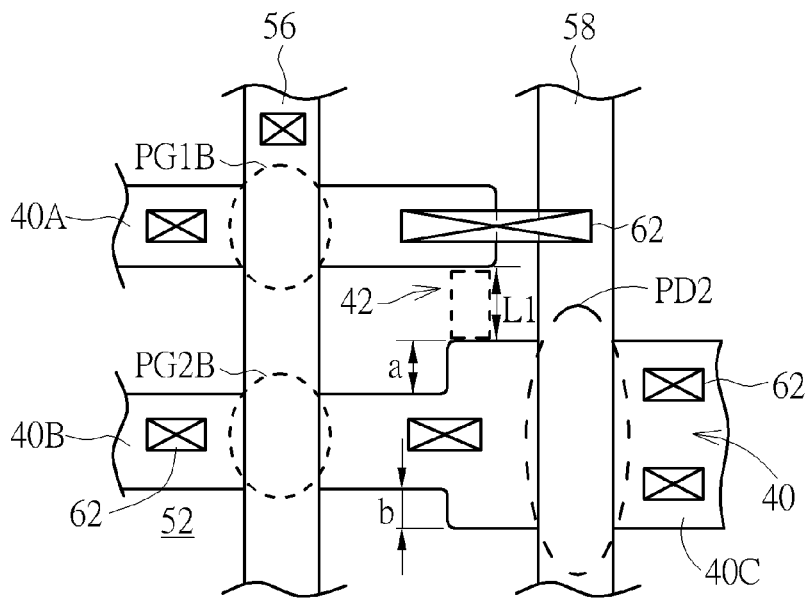
FIG. 3 shows the partial enlarged diagram of FIG. 1.
Figure 4:
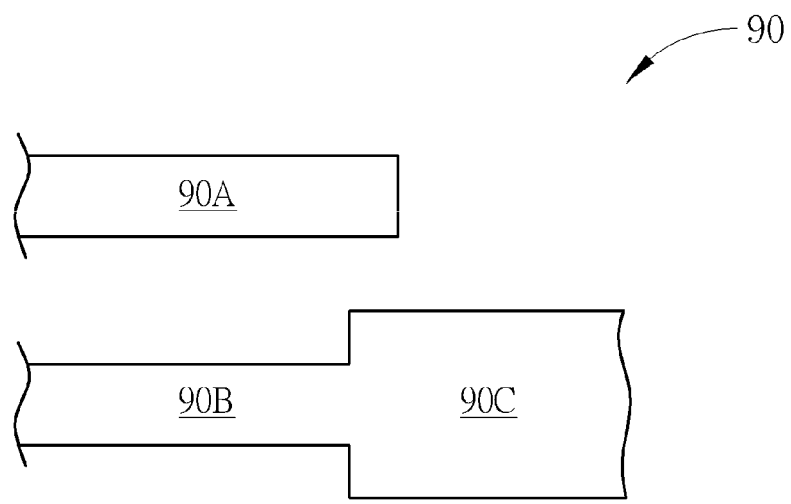
FIG. 4 shows a photomask corresponds to the diffusion regions of FIG. 3.

In order to clearly describe the feature of the diffusion region of the present invention, FIG. 3 shows the partial enlarged diagram of FIG. 1. FIG. 4 shows a photomask corresponds to the diffusion regions of FIG. 3. It is noteworthy that the diffusion regions and partial gate structures compose the active area, and other regions are STI. The photomask shown in FIG. 4 is the masks covering the active area, and STI is then formed in the substrate and out of the active area. Please refer to FIG. 3, the first down access transistor PG1B, the second down access transistor PG2B and the second pull-down transistor PD2 of the 8T-SRAM are shown in FIG. 3. The diffusion region that surrounds the first down access transistor PG1B is defined as the first diffusion region 40A; the diffusion region that surrounds the second down access transistor PG2B is defined as the second diffusion region 40B, the diffusion region that surrounds the second pull-down transistor PD2 is defined as the third diffusion region 40C, and the region having minimum spaces that are disposed between every two adjacent and separated apart diffusion regions is defined as the critical dimension region 42. For example, the first diffusion region 40A and the third diffusion region 40C do not contact each other, therefore, the region that disposed between first diffusion region 40A and the third diffusion region 40C and with the minimum spaces is defined as the critical dimension region 42. The first to the third diffusion regions mentioned above are used as the source/drain regions of the first down access transistor PG1B, the second down access transistor PG2B and the second pull-down transistor PD2 respectively, and all of them are composed of n-type metal oxide semiconductor (NMOS) transistors, so they can be formed simultaneously, but not limited thereto. Afterwards, please refer to FIG. 4, the photomask 90 at least includes a plurality of first patterns 90A (only shown one in FIG. 4) corresponds to the first diffusion region 40A; a plurality of second patterns 90B (only shown one in FIG. 4) corresponds to the second diffusion region 40B; a plurality of third patterns 90C (only shown one in FIG. 4) corresponds to the third diffusion region 40C. It can be understood that there are only parts of the photomask patterns shown in FIG. 4, so the actual photomask should include more patterns than FIG. 4 shows, and correspond to each diffusion region shown in FIG. 1.

With the miniaturization of components, the spacing between elements is also decreased. However, while forming the diffusion regions 40A-40C, different diffusion regions cannot contact each other (for example, the first diffusion region 40A cannot contact the second diffusion region 40B or the third diffusion region 40C), so as to prevent the shorting issue. In the present invention, applicant's experiment found that the critical dimension during the lithography step is about 54 nm. In other words, during the step for forming the STI, a plurality of hard masks are formed and cover the active areas, and the minimum distance between every two adjacent hard masks is about 54 nm. Please refer to FIG. 3. The length L1 of the critical dimension region 42 should be larger than or equal to 54 nm. When the condition is satisfied, the spaces between each the diffusion region 40 can be decreased, but different diffusion regions 40 are still separated and will not contact each other, so as to prevent the shoring issue of the 8T-SRAM. In addition, in one layout pattern of the present invention, the second diffusion region 40B is shifted from the third diffusion region 40C. In other words, the length a and the length b shown in FIG. 3 are different. It can be understood that the layout pattern of the present invention is not limited to the patterns shown in FIG. 3, and can be adjusted according to actual requirements.

The following description will detail the different embodiments of the SRAM of the present invention. To simplify the description, the following description will detail the dissimilarities among the different embodiments and the identical features will not be redundantly described. In order to compare the differences between the embodiments easily, the identical components in each of the following embodiments are marked with identical symbols.

In 8T-SRAM, the beta ratio (β ratio) will influence the performance and the stability of the 8T-SRAM, wherein the beta ratio is equal to the ratio of the passing current of the pull down transistor (such as PD2) to the passing current of the access transistor (such as PG2B). Generally, the beta ratio balances performance and stability. One purpose of the present invention is to increase the beta ratio and to improve the performance of an 8T-SRAM, but still maintain good stability.

Figure 5:
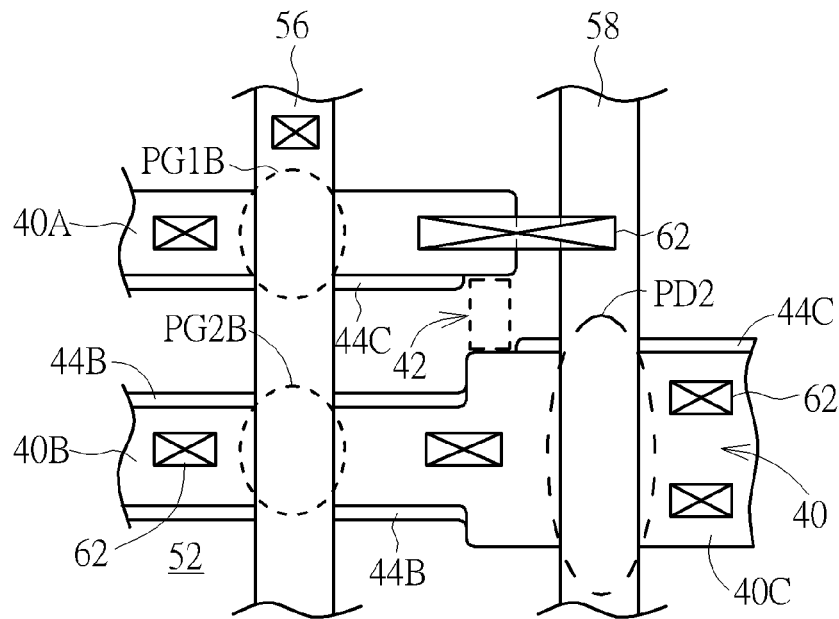
FIG. 5 illustrates a layout diagram of a SRAM according to a second preferred embodiment of the present invention.

FIG. 5 illustrates a layout diagram of a SRAM according to a second preferred embodiment of the present invention. Please refer to FIG. 5, the difference between this embodiment and the first preferred embodiment is further forming a plurality of extra diffusion regions 44 surrounding the first diffusion region 40A, the second diffusion region 40B and the third diffusion region 40C mentioned above. The extra diffusion regions 44 include at least one extra diffusion region 44A, at least one extra diffusion region 44B and at least one extra diffusion region 44C, wherein the extra diffusion region 44A directly contacts the first diffusion region 40A; the extra diffusion region 44B directly contacts the second diffusion region 40B; and the extra diffusion region 44C directly contacts the third diffusion region 40C. Preferably, each extra diffusion region 44 and the first, the second and the third diffusion regions can be formed simultaneously. In other words, the extra diffusion regions 44 can be deemed as the extending portions of the first diffusion region 40A, the second diffusion region 40B and the third diffusion region 40C. In this embodiment, the width of each extra diffusion region 44 is about 5-10 nm, and it may slightly increase the area of the diffusion region. According to the applicant's experiment, the beta ratio can be increased while the area of the diffusion region is increased. For example, in this embodiment, without forming the diffusion region 44, the beta ratio is about 1.80-1.90, and after the diffusion regions 44 are formed, the beta ratio is increased to about 1.90-2.06, and the entire performance of 8T-SRAM also improves about 3%.

It can be understood that even though the extra diffusion regions 44 are only disposed surrounding the first diffusion region 40A, the second diffusion region 40B and the third diffusion region 40C in FIG. 5, the extra diffusion region of the present invention can further be disposed surrounding the diffusion regions of other transistors, such as the diffusion region 40 shown in FIG. 1. Besides, the diffusion regions 44 still satisfy the condition that they are not disposed within the critical dimension region 42, so as to prevent the shorting issue of the 8T-SRAM.

In order to prevent the shorting issue after further forming the extra diffusion regions 44, the extra diffusion regions 44 of the present invention will not be disposed within the critical dimension region 42. Therefore, the extra diffusion regions 44 will not influence the length or the width of the critical dimension region 42, and the length (or the width) of the critical dimension region 42 is still maintained in minimum spaces during the lithography step, thereby preventing the shorting issues.

Figure 6:
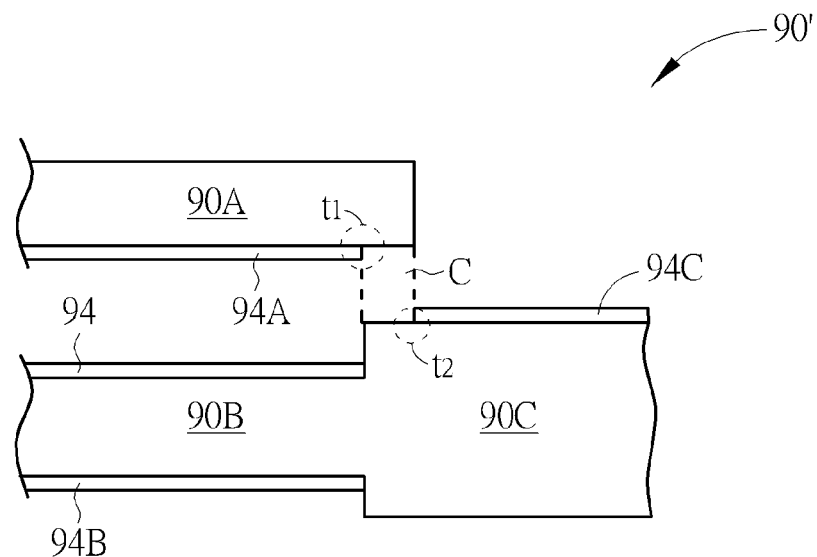
FIG. 6 shows a photomask corresponds to the diffusion regions of FIG. 5.

Besides, the first diffusion region 40A, the second diffusion region 40B, the third diffusion region 40C and the extra diffusion regions 44 are preferably formed through a photomask. Please refer to FIG. 6, which shows a partial photomask used for forming each diffusion region. The photomask 90' includes a plurality of first patterns 90A corresponding to the first diffusion regions 40A; a plurality of second patterns 90B corresponding to the second diffusion regions 40B; a plurality of third patterns 90C corresponding to the third diffusion regions 40C; and a plurality of extra patterns 94, including the extra patterns 94A, 94B and 94C, respectively correspond to the extra diffusion regions 44A-44C mentioned above. In addition, the photomask may further comprise other patterns (not shown), corresponding to the diffusion regions of other transistors shown in FIG. 1. Preferably, each extra pattern 94 is a stripe-shaped structure, disposed surrounding the first pattern 90A, the second pattern 90B and the third pattern 90C, but not disposed within the region that corresponds to the critical dimension region 42 (such as the region C shown in FIG. 6). In this embodiment, an L-shaped angle t1 is disposed between the first pattern 90A and the extra pattern 94A, another L-shaped angle t2 is disposed between the third pattern 90C and the extra pattern 94C, and the region C is disposed between the L-shaped angle t1 and the L-shaped angle t2.

Compared with the first preferred embodiment, the second preferred embodiment further forms the extra diffusion regions surrounding each diffusion region, so the beta ratio can be increased, and thereby improves the performance of the 8T-SRAM, but the 8T-SRAM still maintains a good stability. In addition, each extra diffusion region will not be disposed within the critical dimension region. Therefore, the extra diffusion regions will not influence the length or the width of the critical dimension region, thereby preventing the shorting issues.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A layout pattern of an eight transistors static random access memory (8T-SRAM), comprising:
    a first diffusion region, a second diffusion region and a third diffusion region disposed on a substrate, a critical dimension region being disposed between the first diffusion region and the third diffusion region, wherein the critical dimension region directly contacts the first diffusion region and the third diffusion region; and
    a first extra diffusion region, a second extra diffusion region and a third extra diffusion region disposed surrounding and directly contacting the first diffusion region, the second diffusion region and the third diffusion region respectively, wherein the first, the second and the third extra diffusion region are not disposed within the critical dimension region.

2. The layout pattern of an 8T-SRAM of claim 1, wherein the 8T-SRAM includes a plurality of SRAM cells, each SRAM cell comprising:
    a first pull-up transistor and a second pull-up transistor;
    a first pull-down transistor and a second pull-down transistor;
    a first up access transistor and a second up access transistor; and
    a first down access transistor and a second down access transistor.

3. The layout pattern of an 8T-SRAM of claim 2, wherein the first diffusion region corresponds to the first down access transistor, the second diffusion region corresponds to the second down access transistor, and the third diffusion region corresponds to the second pull-down transistor.

4. The layout pattern of an 8T-SRAM of claim 1, wherein the length of the critical dimension region is equal to or smaller than 54 nanometers (nm).

5. The layout pattern of an 8T-SRAM of claim 1, wherein the width of first extra diffusion region, the width of the second extra diffusion region and the width of the third extra diffusion region is between 5-10 nm.

6. The layout pattern of an 8T-SRAM of claim 1, further comprising at least two gate structures, wherein the first diffusion region, the second diffusion region and the third diffusion region are disposed on two sides of the two gate structures.

7. The layout pattern of an 8T-SRAM of claim 1, wherein the layout pattern is formed through a photomask, the pattern on the photomask comprising:
 a first pattern, a second pattern and a third pattern, corresponding to the first diffusion region, the second diffusion region and the third diffusion region respectively; and
 a plurality of extra patterns, including at least one first extra pattern, at least one second extra pattern and at least one third extra pattern, corresponding to the first extra diffusion region, the second extra diffusion region and the third extra diffusion region respectively.

8. The layout pattern of an 8T-SRAM of claim 7, wherein an L-shaped angle is disposed between the first extra pattern and the first pattern, and another L-shaped angle is disposed between the third extra pattern and the third pattern.

9. The layout pattern of an 8T-SRAM of claim 1, wherein the second diffusion region is shifted apart from the third diffusion region.

10. A method for forming a layout pattern of an eight transistors static random access memory (8T-SRAM), comprising:
 forming a first diffusion region, a second diffusion region and a third diffusion region disposed on a substrate, a critical dimension region being defined and disposed between the first diffusion region and the third diffusion region, wherein the critical dimension region directly contacts the first diffusion region and the third diffusion region; and
 forming a first extra diffusion region, a second extra diffusion region and a third extra diffusion region disposed surrounding and directly contacting the first diffusion region, the second diffusion region and the third diffusion region respectively, wherein the first, the second and the third extra diffusion region are not disposed within the critical dimension region.

11. The method of claim 10, wherein the 8T-SRAM includes a plurality of SRAM cells, each SRAM cell comprising:
 a first pull-up transistor and a second pull-up transistor;
 a first pull-down transistor and a second pull-down transistor;
 a first up access transistor and a second up access transistor; and
 a first down access transistor and a second down access transistor.

12. The method of claim 11, wherein the first diffusion region corresponds to the first down access transistor, the second diffusion region corresponds to the second down access transistor, and the third diffusion region corresponds to the second pull-down transistor.

13. The method of claim 10, wherein the length of the critical dimension region is equal to or smaller than 54 nanometers (nm).

14. The method of claim 10, wherein the width of first extra diffusion region, the width of the second extra diffusion region and the width of the third extra diffusion region is between 5-10 nm.

15. The method of claim 10, further comprising forming at least two gate structures, wherein the first diffusion region, the second diffusion region and the third diffusion region are disposed on two sides of the two gate structures.

16. The method of claim 10, wherein the layout pattern is formed through a photomask, the pattern on the photomask comprising:
 a first pattern, a second pattern and a third pattern, corresponding to the first diffusion region, the second diffusion region and the third diffusion region respectively; and
 a plurality of extra patterns, including at least one first extra pattern, at least one second extra pattern and at least one third extra pattern, corresponding to the first extra diffusion region, the second extra diffusion region and the third extra diffusion region respectively.

17. The method of claim 16, wherein an L-shaped angle is disposed between the first extra pattern and the first pattern, and another L-shaped angle is disposed between the third extra pattern and the third pattern.

18. The method of claim 10, wherein the second diffusion region is shifted apart from the third diffusion region.

19. The method of claim 10, wherein the first diffusion region, the second diffusion region, the third diffusion region and the first extra diffusion region, the second extra diffusion region, and the third extra diffusion region are formed simultaneously.

* * * * *